US008766274B2

(12) United States Patent
Craft et al.

(10) Patent No.: US 8,766,274 B2
(45) Date of Patent: Jul. 1, 2014

(54) THERMAL EXPANSION ENGINEERING FOR POLYCRYSTALLINE ALUMINUM NITRIDE SINTERED BODIES

(75) Inventors: Spalding Craft, Raleigh, NC (US); Baxter Moody, Raleigh, NC (US); Rafael Dalmau, Raleigh, NC (US); Raoul Schlesser, Raleigh, NC (US)

(73) Assignee: Hexatech, Inc., Morrisville, NC (US)

( * ) Notice: Subject to any disclaimer, the term of this patent is extended or adjusted under 35 U.S.C. 154(b) by 378 days.

(21) Appl. No.: 13/324,261

(22) Filed: Dec. 13, 2011

(65) Prior Publication Data

US 2012/0146023 A1   Jun. 14, 2012

Related U.S. Application Data

(60) Provisional application No. 61/422,847, filed on Dec. 14, 2010.

(51) Int. Cl.
*H01L 31/0256* (2006.01)
*H01L 21/20* (2006.01)
*H01L 21/36* (2006.01)

(52) U.S. Cl.
USPC ..... 257/76; 257/103; 257/E21.123; 257/E23.062; 438/478

(58) Field of Classification Search
USPC ............ 257/76, 103, 524, E21.123, E23.062; 438/22, 97, 478; 106/286.4
See application file for complete search history.

(56) References Cited

U.S. PATENT DOCUMENTS

| | | | |
|---|---|---|---|
| 4,478,785 A | 10/1984 | Huseby et al. | |
| 4,578,232 A | 3/1986 | Huseby et al. | |
| 4,578,233 A | 3/1986 | Huseby et al. | |
| 4,578,234 A | 3/1986 | Huseby et al. | |
| 4,719,187 A | 1/1988 | Bardhan et al. | |
| 4,908,173 A | 3/1990 | Schwetz et al. | |
| 5,320,990 A | 6/1994 | Guiton et al. | |
| 5,541,145 A | 7/1996 | Harris et al. | |
| 5,773,377 A | 6/1998 | Harris et al. | |
| 6,315,945 B1 | 11/2001 | Macki et al. | |
| 7,799,269 B2 | 9/2010 | Wei et al. | |
| 8,580,593 B2 * | 11/2013 | Pinnington | 438/47 |
| 2005/0218416 A1 | 10/2005 | Cho et al. | |
| 2006/0154827 A1 | 7/2006 | Kanechika et al. | |
| 2006/0163605 A1 | 7/2006 | Miyahara | |
| 2006/0183625 A1 | 8/2006 | Miyahara | |
| 2006/0255341 A1 | 11/2006 | Pinnington et al. | |
| 2007/0131160 A1 | 6/2007 | Slack et al. | |
| 2007/0243653 A1 | 10/2007 | Morgan et al. | |
| 2007/0243703 A1 | 10/2007 | Pinnington et al. | |
| 2007/0289946 A1 | 12/2007 | Schowalter et al. | |
| 2010/0314551 A1 | 12/2010 | Bettles et al. | |

FOREIGN PATENT DOCUMENTS

| | | |
|---|---|---|
| EP | 0 940 845 A2 | 8/1999 |
| JP | 9110405 | 4/1997 |
| JP | 2005335992 | 12/2005 |
| JP | 2007327125 | 12/2007 |

OTHER PUBLICATIONS

Tangen et al., "Preparation and Characterisation of Aluminum Nitride-Titanium Nitride Composites," *Journal of European Ceramic Study*, 2004, pp. 2169-2179, vol. 24.
Aigner et al., "Lattice Parameters and Thermal Expansion of Ti(CxN1-x), Zr(CxN1-x), Hf(CxN1-x) and TiN1-x from 298 to 1473 K as Investigated by High-Temperature X-ray diffraction," *Journal of Alloys and Compounds*, vol. 215, pp. 121-126 (1994).
Austin, "The Thermal Expansion of Some Refractory Oxides," *J. Amer. Cer. Soc.*, vol. 14, No. 11, pp. 795-810 (1931).
Engberg et al., "Thermal Expansion of $Al_2O_3$, BeO, MgO, $B_4C$, SiC, and TiC Above 1000° C.," *J. Amer.Cer. Soc.* vol. 42, No. 6 (1959).
Leszcynski et al., "Thermal Expansion of Gallium Nitride," *J. Appl. Phys.*, vol. 76, No. 8, pp. 4909-4911 (1994).
Paszkowicz et al., "Rietveld Refinement for Indium Nitride int eh 105-295 K Range," *Powder Diffraction*, vol. 18, No. 2, pp. 114-121 (2003).
Reeber et al., "Lattice Parameters and Thermal Expansion of GaN," *J. Mater. Tes.*, vol. 15, No. 1, pp. 40-44, (2000).
Roder et al., "Temperature Dependence of the Thermal Expansion of GaN," *Physical Review B*, vol. 72, pp. 085218-1 to 085218-6 (2005).
Slack et al., "Thermal Expansion of Some Diamondlike Crystals," *Journal of Applied Physics*, vol. 46, No. 1, pp. 89-98 (1975).
Wang et al., "Thermal Expansion of GaN and AlN," *Mat. Res. Soc. Symp. Proc.*, vol. 482, pp. 863-868 (1998).
Wang et al., "Thermal Expansion and Elastic Properties of InN," *Applied Physics Letters*, vol. 79, No. 11, pp. 1602-1604 (2001).
Wokulski, "Thermal Expansion of Whiskers of Ti(C,N) Solid Solutions," *Journal of Alloys and Compounds*, vol. 264, pp. 223-227 (1998).

* cited by examiner

*Primary Examiner* — Hoai V Pham
(74) *Attorney, Agent, or Firm* — Womble Carlyle Sandridge & Rice, LLP

(57) ABSTRACT

Disclosed are methods and materials useful in the preparation of semiconductor devices. In particular embodiments, disclosed are methods for engineering polycrystalline aluminum nitride substrates that are thermally matched to further materials that can be combined therewith. For example, the polycrystalline aluminum nitride substrates can be engineered to have a coefficient of thermal expansion (CTE) that is closely matched to the CTE of a semiconductor material and/or to a material that can be used as a growth substrate for a semiconductor material. The invention also encompasses devices incorporating such thermally engineered substrates and semiconductor materials grown using such thermally engineered substrates. The thermally engineered substrates are advantageous for overcoming problems caused by damage arising from CTE mismatch between component layers in semiconductor preparation methods and materials.

46 Claims, No Drawings

THERMAL EXPANSION ENGINEERING FOR POLYCRYSTALLINE ALUMINUM NITRIDE SINTERED BODIES

CROSS-REFERENCE TO RELATED APPLICATIONS

The present application claims priority to U.S. Provisional Patent Application No. 61/422,847, filed Dec. 14, 2010, the disclosure of which is incorporated herein by reference in its entirety.

FIELD OF THE INVENTION

The present invention relates to polycrystalline aluminum nitride substrates that are engineered to be thermally matched to one or more layers that are associated with the substrates such that the incidence of layer damage related to thermal expansion during further processing or use is reduced or eliminated. In particular, the polycrystalline aluminum nitride substrates are engineered to have a coefficient of thermal expansion (CTE) that closely matches the CTE of the layers associated therewith. Such thermal expansion engineering can comprise, for example, introducing or forming a second phase material (in addition to the first phase aluminum nitride) such that the CTE of the multiphase polycrystalline aluminum nitride substrate is appropriately different from the CTE of substantially pure aluminum nitride and, preferably, is closely matched to the CTE of the layer or layers to be associated with the polycrystalline aluminum nitride substrate.

BACKGROUND

There is an ever increasing desire for high performance, low cost electronic, optronic, and optoelectronic device structures. Typically, such structures can be prepared by deposition of crystalline thin films onto substrates which act as epitaxial templates for the deposited films. The optimization of such device structures, however, can be limited by the physical properties of the substrate material that is used.

Heretofore, it has been difficult to optimize matching of the coefficient of thermal expansion (CTE) between bonded layers and their substrates because of reasons such as lack of commercially available suitable substrates or prohibitively high cost of production of suitable substrates. For example, Ge and InP substrates are respectively well lattice-matched to films such as GaAs and InGaAs that are used in terrestrial and space-based photovoltaics. The cost of these substrate materials, however, is relatively high compared to competing substrates such as silicon. Similarly, bulk GaN substrates can be preferred for deposition of GaN-based films; however, GaN-based films are conventionally deposited on non-lattice-matched substrates, such as sapphire or SiC, in light of the high cost of bulk GaN substrates. This is not ideal, however, because the high lattice mismatch and high CTE mismatch between GaN films and sapphire or SiC substrates limits the performance of such substrates.

Polycrystalline aluminum nitride substrates can be particularly useful as a relatively low cost substrate in preparation of electronic, optronic, and optoelectronic device structures in light of the useful properties of polycrystalline AlN, such as high strength, oxidation resistance, thermal shock resistance, high thermal conductivity, low electrical conductivity, and resistance to corrosion by liquid metals. Problems still can arise, however, when using polycrystalline AlN substrates in device construction, such as thermal expansion mismatch between the polycrystalline aluminum nitride substrate and other layers bonded thereto. Accordingly, it would be useful to have substrates providing the highly favorable characteristics of polycrystalline AlN while also overcoming the problems associated with CTE mismatch between the substrate and the layers bonded thereto.

SUMMARY OF THE INVENTION

The present invention provides materials and methods that can be used in relation to semiconductor technologies. More particularly, the materials and methods provide for improvements in semiconductor manufacturing by reducing material losses arising from mismatch of the coefficient of thermal expansion (CTE) of materials used in different layers of a semiconductor device and/or a substrate material used in the preparation of a semiconductor device. The invention particularly can be characterized in relation to the ability to provide polycrystalline aluminum nitride base substrates that can be thermally engineered to have a customized CTE that can be closely matched to the CTE of a growth layer that can be transferred thereto, a semiconductor material that can be formed on the growth layer, or both a growth layer and a grown semiconductor layer.

In certain embodiments, the invention provides a thermally engineered substrate that can be used in the preparation of semiconductor materials or in the preparation of intermediate substrates that are used in the preparation of semiconductor materials. In some embodiments, the thermally engineered substrate can comprise a multiphase material including polycrystalline aluminum nitride as a first phase. The multiphase material also can comprise one or more further phases that can function to alter the CTE of the overall substrate. Preferably, the further phases are present in sufficient amount such that the substrate will have a CTE that is different (e.g., greater) than the CTE of substantially pure aluminum nitride at the same temperature by an amount of about 10% or greater. The multiphase material may be formed by a variety of processes. For example, the multiphase material can be a pressed material or a pressed and sintered material. As another example, the invention may be applied to other methods of manufacture, such as tape casting.

In some embodiments, the thermally engineered substrate can include, as a second phase, an additive material that is chemically non-reactive with AlN and that has a CTE that is greater than the CTE of substantially pure AlN at the same temperature. For example, the second phase comprises about 5% or greater by weight of the substrate. In one embodiment, the second phase can comprise titanium nitride. Other materials likewise may be used.

In other embodiments, the thermally engineered substrate can include, as a second phase, the product of a reaction between AlN and an additive material (i.e., a precursor material), the reaction product having a CTE that is greater than the CTE of substantially pure AlN at the same temperature. Again, the second phase material reaction product can comprise about 5% or greater by weight of the substrate. For example, the second phase can comprise the product of a reaction between aluminum nitride and aluminum oxide. Other reaction products also may comprise the second phase.

In specific embodiments, the thermally engineered substrate can be formed to exhibit a CTE that closely matches the CTE of other materials. For example, in one embodiment, the substrate can have a CTE that is within about 25% of the CTE of substantially pure gallium nitride at the same temperature. In further embodiments, even closer matching can be achieved.

In some embodiments, the invention can relate specifically to an intermediate substrate composition that is useful for growth of a semiconductor material thereon. In particular, the intermediate substrate can comprise a semiconductor growth layer overlying a polycrystalline aluminum nitride base substrate that is thermally matched to the growth layer. For example, the semiconductor growth layer and the polycrystalline AlN base substrate each can have a coefficient of thermal expansion (CTE) that is different than (e.g., greater than) the CTE of substantially pure polycrystalline AlN at the same temperature. If a growth layer having a CTE lower than the CTE of substantially pure AlN was used, it would be possible according to the invention to use a polycrystalline AlN base substrate that is thermally engineered to likewise have a CTE that is lower than the CTE of substantially pure AlN. As an example, in specific embodiments, the CTE of the polycrystalline AlN base substrate can exceed the CTE of substantially pure polycrystalline AlN at the same temperature by an amount of about 10% or greater. In other embodiments, the CTE of the polycrystalline AlN base substrate can be within about 25% of the CTE of the semiconductor growth layer at the same temperature. Of course, the polycrystalline AlN base substrate can be thermally engineered to exhibit further CTE values relative to substantially pure AlN, relative to a semiconductor growth layer, or relative to a grown semiconductor layer, as otherwise described herein.

The semiconductor growth layer can comprise any material that may be useful for growing a semiconductor thereon. In specific embodiments, the semiconductor growth layer can comprise a Group III-Nitride material, such as gallium nitride. In preferred embodiments, the growth layer may be a single crystal material. Of course, the specific composition of the growth layer will determine the CTE of the growth layer, and the polycrystalline AlN base substrate can be engineered to closely match such CTE.

In certain embodiments, the polycrystalline AlN base substrate can comprise polycrystalline AlN as a first phase component and further comprises a second phase component (and a third phase component or even more phases, as may be beneficial for customizing CTE). Preferably, the inclusion of the second phase component (or further phases) alters the overall CTE of the base substrate to be in the desired range. For example, the second phase component can comprise an additive material that is chemically non-reactive with AlN and that has a CTE that is different than (e.g., greater than) the CTE of substantially pure AlN at the same temperature. As before, if it is desired for the CTE of the base substrate to be lower than the CTE of substantially pure AlN, the second phase component can comprise a material having a CTE that is less than the CTE of substantially pure AlN. In a specific embodiment, the additive material can comprise titanium nitride.

In further embodiments, the second phase component can comprise the product of a reaction between AlN and an additive material (i.e., precursor material). Preferably, the additive material is selected such that the second phase reaction product will have a CTE that is greater than (or less than, as desired) the CTE of substantially pure AlN at the same temperature. In some embodiments, it can be desirable for substantially all of the precursor additive material to be reacted or removed after a sufficient time for reaction has passed so that the base substrate is substantially free of any content of the precursor material and only substantially comprises AlN and the reaction product or products. Depending upon the purity of the AlN used, a small content of impurities may remain, as otherwise described herein. In other embodiments, some content of the precursor material may remain in the base substrate after completion of the reaction. The CTE of the final base substrate can be calculated based on the known reaction stoichiometries of the AlN and the additive, the content of the formed reaction product, and the remaining content of the unreacted precursor material. In one embodiment, the reaction product can be the product of reaction between AlN and aluminum oxide.

In addition to the base substrate and the growth layer, an intermediate substrate according to the invention may further comprise one or more additional layers positioned between the semiconductor growth layer and the polycrystalline AlN base substrate or positioned overlying the semiconductor growth layer. As further described herein, the one or more further layer may be useful in the growth of the semiconductor layer, may be useful for altering the properties of the semiconductor layer grown on the intermediate substrate, or may be useful for facilitating bonding of the growth layer to the base substrate.

In certain embodiments, the invention particularly can relate to devices formed using an intermediate substrate as described herein. For example, the device can be selected from the group consisting of electronics, optronics, and optoelectronics. In specific embodiments, the device can be selected from the group consisting of light emitting diodes, laser diodes, high electron mobility transistors, heterostructure bipolar transistors, radio frequency power amplifiers, high voltage switching devices for power grids, photodetectors, solar cells, spin transport electronics, metal oxide semiconductor field effect transistors, metal semiconductor field effect transistors, integrated logic/compound semiconductor devices, and similar devices. More specific articles of manufacture encompassed by the invention incorporating semiconductor devices as described herein can be selected from the group consisting of color displays (e.g., text and video displays), traffic lights, automotive lighting, aerospace lighting, commercial lighting, residential lighting, infrared remote devices, image scanners, video devices, photography devices, sensors (such as in medical equipment, computing devices, and gaming devices), touch screens, ultraviolet disinfection and sterilization devices, ultraviolet curing devices, printers, machine vision devices (e.g., barcode scanners), and high-density optical storage disks.

In further embodiments, the present invention can relate to methods of preparing a polycrystalline AlN substrate for growth of a semiconductor material thereon. In specific embodiments, such method can comprise the following steps: combining first phase AlN with a content of second phase particles having a CTE that is different than the CTE of the AlN particles; and processing the materials to form the polycrystalline AlN substrate to form a multiphase AlN material having a CTE that is different than the CTE of substantially pure AlN at the same temperature. More specifically, such processing may comprise pressing the AlN particles and the second phase particles to form a pressed slug; and sintering the pressed slug to form a sintered multiphase AlN material having a CTE that is different than the CTE of substantially pure AlN at the same temperature. As noted previously, the content of the second phase particles (or further phase materials) can be calculated based upon the known CTE of the second phase material so that the combination of the AlN and the second phase material achieves a composite material having a CTE falling in a range between the CTE of substantially pure AlN and the CTE of the second phase material. In one embodiment, an example of a suitable additive material for combination with AlN to alter the CTE thereof is TiN. Preferably, the CTE of the engineered polycrystalline multiphase AlN base substrate is closely matched to the CTE of a different material that may be layered on the multiphase AlN material. For example, the sintered multiphase AlN material may be engineered to have a CTE that is within a specified range that closely matches the CTE of a Group III-Nitride material, such as GaN.

In preparation of the polycrystalline multiphase AlN material, specific processing parameters may be employed. For example, in some embodiments, the pressing step may be carried out in the absence of any applied heat. In further embodiments, the sintering step may be carried out in a chamber that is evacuated of ambient gases and, preferably, can be carried out in an $N_2$ atmosphere. In other embodiments, the method further can comprise polishing at least one surface of the sintered multiphase AlN material.

In certain embodiments, further methods of preparing a polycrystalline AlN substrate can comprise eliciting formation of a reaction product. For example, such method can comprise the following steps: combining first phase AlN with a content of a precursor material that reacts with AlN to form a second phase reaction product having a CTE that is different than the CTE of the AlN; and further processing the materials to form a multiphase AlN material having a CTE that is different than the CTE of substantially pure AlN at the same temperature. In some embodiments, further processing particularly can comprise pressing together the AlN with the reaction product (and/or precursor material) combined therewith to form a pressed slug; and sintering the pressed slug to form a sintered multiphase AlN material having a CTE that is different than the CTE of substantially pure AlN at the same temperature. Such methods may be carried using specific processing parameters, such as noted above and further described herein. In one embodiment, an example of a suitable precursor material for reaction with AlN to form one or more reaction products that have a CTE that is different from the CTE of substantially pure AlN is $Al_2O_3$.

In still further embodiments, the invention also can provide methods of preparing intermediate substrates useful for growth of a semiconductor material thereon. Specifically, the method can comprise overlaying a semiconductor growth layer on a thermally engineered polycrystalline aluminum nitride substrate as described herein. For example, such methods can comprise the following steps: providing a polycrystalline AlN base substrate having a CTE that is different than the CTE of substantially pure polycrystalline AlN at the same temperature; and overlaying on the base substrate a semiconductor growth layer. In specific embodiments, the polycrystalline AlN base substrate can be a substrate that has been engineered to have a CTE that is within a certain range the CTE of the semiconductor growth layer at the same temperature. Thus, with knowledge of the CTE of the semiconductor growth layer material, it is possible to prepare or obtain a polycrystalline AlN base substrate that is engineered to have a CTE falling within the desired range that is close to or identical with the CTE of the growth layer material. The so prepared intermediate substrate material thus is formed to have physical properties such that when the intermediate substrate is later used to grow a semiconductor material or layer, the CTE matching of the base substrate and the growth layer will prevent damage that could otherwise arise from thermal expansion (e.g., in an epitaxial growth process that is carried out at elevated temperatures). In further embodiments, the polycrystalline AlN base substrate can be a substrate that has been engineered to have a CTE that is within a certain range the CTE of the semiconductor material or layer that is to be grown on the growth layer. In specific embodiments, the CTE of the polycrystalline AlN base substrate can be in a range that closely matches the CTE of the growth layer and the CTE of the semiconductor material to be grown. To this end, the polycrystalline AlN base substrate can be prepared by any suitable methods as described herein (e.g., via combination with an additive material having a CTE different from the CTE of substantially pure AlN or with a precursor material that reacts with AlN to form one or more reaction products having a different CTE from substantially pure AlN).

The methods for preparing an intermediate substrate according to the present invention also may comprise providing one or more additional layers. For example, it may be useful in some embodiments to provide one or more additional layers positioned between the semiconductor growth layer and the polycrystalline AlN base substrate. In other embodiments, it may be useful to provide one or more additional layers positioned overlying the semiconductor growth layer. The advantages of providing such additional layers are further described herein.

In still further embodiments, the invention also can provide methods for preparing a semiconductor material. The method can comprise growing a semiconductor layer on an intermediate substrate as described herein. For example, in specific embodiments, the invention can encompass the following steps: providing an intermediate substrate comprising a multiphase, polycrystalline AlN base substrate as described herein and further comprising a semiconductor growth layer bonded to the base substrate, wherein the CTE of the base substrate is within a defined range of the CTE of the semiconductor growth layer at the same temperature; and growing a semiconductor layer on the growth layer. Such methods are particularly useful for facilitating growth of a semiconductor material while reducing or eliminating the occurrence of device damage or failure arising from thermal expansion of the intermediate substrate. Moreover, it is possible to prepare or obtain an intermediate substrate wherein the base substrate is not only closely CTE matched with the growth layer but also is closely CTE matched with the semiconductor material to be grown. In this manner, any damaging effects of thermal expansion can be reduced or eliminated in relation to the base substrate, the growth layer, and the grown semiconductor layer. The semiconductor material may be grown by any suitable method in the art, such as chemical vapor deposition (CVD), metalorganic chemical vapor deposition (MOCVD), molecular beam epitaxy (MBE), hydride vapor phase epitaxy (HYPE), and ion beam assisted deposition (MAD).

The methods for preparing a semiconductor material according to the present invention also may comprise providing one or more additional layers. For example, it may be useful in some embodiments to provide one or more additional layers positioned between the semiconductor growth layer and the semiconductor layer. In other embodiments, it may be useful to provide one or more additional layers positioned overlying the semiconductor layer.

DETAILED DESCRIPTION OF THE INVENTION

The invention now will be described more fully hereinafter through reference to various embodiments. These embodiments are provided so that this disclosure will be thorough and complete, and will fully convey the scope of the invention to those skilled in the art. Indeed, the invention may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

The present invention provides useful methods and materials related to preparation of electronic, optronic, and optoelectronic devices. The invention particularly relates to substrates, intermediate substrates, and the like that can be useful in the preparation of semiconductor devices—e.g., light emitting diodes (LEDs), laser diodes (LDs), etc. Specifically, the substrates and intermediate substrates can provide significant performance and cost advantages over traditional bulk substrates used in preparing semiconductor devices, particularly such devices incorporating Group III materials, and more particularly Group III-Nitride materials. The inventive methods and materials also overcome problems in the field related to the use of laminate substrates—i.e., thin crystalline films attached to an underlying support substrate (also sometimes called a handle substrate). For example, in the field of LEDs and LDs in particular, it can be useful to grow Group III-Nitride films on laminate substrates formed of a GaN or AlN buffer layer attached to a handle substrate, such as silicon, gallium arsenide, or sapphire. As previously pointed out, however, CTE mismatches between the substrate and the buffer layer can still lead to serious processing damages, particularly at the increased temperatures required in typical semiconductor preparation processes—e.g., epitaxial methods. CTE mismatch strain can develop at different stages of the growth process. Prior to deposition of the epitaxial layers, CTE mismatch strain can develop when the laminate substrate is heated to either the pre-growth annealing temperature or the growth temperature. During growth, CTE mismatch can change the strain state of the laminate film and the deposited layers when the temperature is cycled to different values (e.g., such as is commonly used in epitaxial growth to optimize the properties of different layers). CTE mismatch between the grown layers and the support substrate can result in substantial strain in the grown layers when the substrate is cooled to room temperature following growth. Post growth thermal processing (e.g., in laser lift off, heat sink attachment, and contact alloying) can induce further changes in the strain state of the grown layers.

While CTE matching may be achieved in some instances by unusual substrate choices (e.g., sintered molybdenum bonded to sapphire), such choices lack flexibility and customizability. Since the art has previously lacked low cost, commercially available bulk substrates of Group III-nitride materials, the growth of Group III-nitrides has commonly been performed on substrates that differ greatly in lattice constant with the device layer lattice constant. The present invention, however, provides the ability to use a highly flexible material—polycrystalline aluminum nitride—that has many desirable properties. The ability to extend the use of polycrystalline aluminum nitride as a CTE matched substrate arises from the recognition of the ability to thermally engineer polycrystalline aluminum nitride wafers to exhibit customizable CTE values.

In certain embodiments, the invention relates to intermediate substrates that can be useful for the growth of semiconductor materials (i.e., layers) thereon. As used herein, the term "semiconductor material" is understood to relate to single layer and multilayer materials that may find use in the formation of electronic, optronic, and/or optoelectronic devices.

Intermediate substrates according to the invention can be characterized by the specific combination of a semiconductor growth layer overlying a polycrystalline AlN base substrate that is thermally matched to the growth layer. As used herein, the term "overlying" is intended to describe a physical relationship indicating that the two layers are combined to form a unitary structure. The growth layer is considered to "overlie" the base substrate in that the semiconductor material is grown over the growth layer and not directly on the base substrate layer, and the term does not necessarily indicate an absolute directional arrangement. Rather, it indicates that the growth layer is directly or indirectly attached to the base substrate. The unitary structure can be such that the layers are permanently combined (i.e., inseparable absent application of forces that would destroy or otherwise render one or both of the layers unusable for their intended purposes) or temporarily combined (i.e., do not spontaneously separate absent application of specific means to achieve separation). In some embodiments, the layers may be combined via weak forces. In other embodiments, the layers may be adhered or laminated together.

In further embodiments, the intermediate substrate can comprise one or more additional layers. Such additional layers can be positioned between the semiconductor growth layer and the polycrystalline AlN base substrate. Such intermediate layers can, in some embodiments, be useful to facilitate adhesion of the growth layer to the base substrate. Further, additional layers can be positioned overlying the semiconductor growth layer. Such additional overlying layers, in some embodiments, can be useful to facilitate growth of the semiconductor material on the intermediate substrate. The inclusion of the additional layers would not be construed as changing the status of the growth layer as overlying the base substrate layer. The additional layers may facilitate indirect attachment of the growth layer to the base substrate.

While polycrystalline AlN is a desirable base substrate in light of its many useful properties as otherwise described above, the coefficient of thermal expansion (CTE) of AlN can be sufficiently different from the materials used in the semiconductor growth layer or in other layers grown thereon. Such differences in CTE can lead to problems, such as bowing, cracking, delamination, and the like. The CTE of a material can vary between ambient conditions (i.e., room temperature) and elevated temperatures (e.g., temperatures at which epitaxial growth of a device structure occurs). Typically, CTE is measured in one or both of the a-axis and the c-axis of the material being tested and thus can be reported as $\alpha_a$ or $\alpha_c$ at a specific temperature or averaged over a range (e.g., from room temperature to 1,000° K).

As reported in the literature, the CTE ($\alpha_a$) of substantially pure AlN at room temperature is approximately $3.0 \times 10^{-6}$ K$^{-1}$ (see Wang and Reeber, 1998, *Mat. Res. Soc. Symp. Proc.*, vol. 482). As used herein, the term "substantially pure AlN" means AlN that has not been intentionally doped with any combinatorial materials but rather only includes aluminum nitride and any de minimis amount of impurities. In specific embodiments, substantially pure AlN can refer to AlN that does not include any further Group III or Group V elements. In some embodiments, substantially pure AlN can refer to AlN that is at least 98%, at least 98.5%, at least 99%, at least 99.25%, at least 99.5%, at least 99.75%, at least 99.8%, or at least 99.9% by weight pure (i.e., pure aluminum and nitrogen). Methods for determining the CTE of materials are described and referenced by Wang and Reeber, as noted above. One further standardized method for evaluating linear thermal expansion of materials is provided in ASTM C372-94 (2007). The noted disclosures regarding measuring thermal expansion are incorporated herein by reference, and it is expected that one of skill in the art would be able to use such methods to determine the CTE of further materials that could be used in light of the present disclosure.

The semiconductor growth layer overlying the polycrystalline AlN base substrate can comprise any material that is useful in the preparation of semiconductor materials and devices as otherwise described herein. In specific embodiments, the growth layer can comprise any combination of Group III and Group V elements. In preferred embodiments, the growth layer can comprise a Group III-Nitride. Non-limiting examples of materials that may be included in the growth layer include GaN, AlN, AlGaN, InGaN, InN, InAlGaN, AlInN, AlGaAs, GaP, GaAs, GaAsP, and AlGaInP. In preferred embodiments, the semiconductor growth layer can comprise a single crystal material, such as single crystal GaN.

Because the semiconductor growth layer may be formed of a material that is different from the polycrystalline AlN material, the CTE of the growth layer can be significantly different from the CTE of the substantially pure AlN used in the base substrate. Because CTE values can vary depending upon temperature, thermal matching according to the invention can be referenced to specific temperatures to provide a meaningful relationship between the respective values of the CTE for the different materials. For example, the CTE of the polycrystalline AlN and the CTE of the material used in the growth layer may both be referenced to values obtained at room temperature, values obtained at a specific elevated temperature (e.g., a temperature at which epitaxy may occur), or values that are averaged across a specific range (e.g., about room temperature to about 1,000° K). In specific embodiments, CTE values may be referenced to the same temperature, such as 298° K, 300° K, 400° K, 500° K, 600° K, 700° K, 800° K, 900° K, 1,000° K, 1,100° K, or 1,200° K, or CTE values may be referenced to a value averaged across any range of the above temperatures (e.g., the range of about 800° K to about 1,200° K, for example). Thus, thermal matching of the materials may be described as having a defined relationship at the same temperature (e.g., the CTE of the base substrate and the CTE of the growth layer when measured at the same temperature). For example, cracks and other detriments can arise in GaN device layers upon cooling after epitaxial growth. Thus, it can be particularly relevant for the CTE of the base substrate to be matched to the CTE of the growth layer at the epitaxial growth temperature and/or in a temperature range somewhat below the growth temperature (i.e., the cooling range). Thus, the present invention should not be construed as limited to CTE values of different materials at different temperatures. Rather, the invention envisions that damages associated with thermal expansion of materials can be alleviated by closely matching the CTE of materials at relative temperatures.

Gallium nitride, for example, has a CTE ($\alpha_a$) at room temperature of approximately $4.0 \times 10^{-6}$ $K^{-1}$ (see Wang and Reeber, 1998, *Mat. Res. Soc. Symp. Proc., vol.* 482), and indium nitride has a CTE ($\alpha_a$) at room temperature of approximately $3.8 \times 10^{-6}$ $K^{-1}$ (see Wang and Reeber, 2001, *Appl. Phys. Lett.*, vol. 79, no. 11, pp. 1602-1604), both of the above disclosures being incorporated herein by reference. For simplicity of disclosure, the invention may be discussed herein in relation to the use of GaN as the semiconductor growth layer. It is understood, however, that the skilled person would be able to envision the application of the invention to other semiconductor growth materials in light of the discussion regarding GaN, and all other such growth materials are intended to be encompassed by the present invention.

Materials typically used as a semiconductor growth layer according to the invention generally have a CTE that is greater than the CTE of substantially pure AlN when measured at the same temperature. Thus, in specific embodiments, the semiconductor growth layer and the polycrystalline AlN base substrate can each have a CTE that is greater than the CTE of substantially pure polycrystalline AlN at the same temperature. Of course, the invention should not be viewed as being limited to thermal engineering to CTE values greater than the CTE of substantially pure polycrystalline AlN. Rather, the polycrystalline AlN can be engineered to match CTE values that are less than the CTE of substantially pure AlN if such would be desirable (e.g., when the semiconductor growth layer comprises a material having a CTE less than the CTE of substantially pure AlN at the same temperature).

In specific embodiments, so as to match the CTE of a semiconductor growth layer, a polycrystalline AlN base substrate according to the invention can be thermally engineered to have a CTE that differs from the CTE of substantially pure polycrystalline AlN at the same temperature by an amount of about 2% or greater. In further embodiments, a polycrystalline AlN base substrate according to the invention can be thermally engineered to have a CTE that differs from the CTE of substantially pure polycrystalline AlN at the same temperature by an amount of about 5% or greater, about 10% or greater, about 15% or greater, about 20% or greater, about 25% or greater, about 30% or greater, about 35% or greater, about 40% or greater, about 45% or greater, or about 50% or greater. Such values also could apply to any embodiment where it may be desirable to engineer the AlN base substrate to have a CTE that is less than the CTE of substantially pure AlN at the same temperature or to have a CTE that is greater than the CTE of substantially pure AlN at the same temperature. In preferred embodiments, the CTE is engineered to exceed the CTE of substantially pure AlN at the same temperature. Through use of such thermal engineering according to the invention, the polycrystalline AlN base substrate can be substantially thermally matched to the semiconductor growth layer so that the respective CTE of each material at the same temperature or temperature range is sufficiently close to prevent damage that may occur as a result of CTE mismatching. In certain embodiments, the polycrystalline AlN substrate can be understood as being sufficiently thermally matched to the semiconductor growth layer when the CTE of the base substrate is within a specified range in relation to the CTE of the growth layer. For example, it can be desirable for the CTE of the polycrystalline AlN base substrate to be within about 25% of the CTE of the semiconductor growth layer at the same temperature. In further embodiments, it can be desirable for the CTE of the polycrystalline aluminum nitride base substrate to be within about 20%, within about 15%, within about 12%, within about 10%, within about 9%, within about 8%, within about 7%, within about 6%, within about 5%, within about 4%, within about 3%, within about 2%, or within about 1% of the CTE of the semiconductor growth layer at the same temperature.

Thermal engineering of a polycrystalline AlN base substrate according to the invention can be achieved by altering the composition of the base substrate to form an AlN composite or alloy. More specifically, the polycrystalline AlN used in forming the base substrate can be combined with at least one additional material or component to form a composite base substrate or a base substrate alloy. In some embodiments, the polycrystalline AlN can be referred to as a first phase component and the at least one additional material can be referred to as a second phase component. The second phase component can, in particular embodiments, have a CTE that is greater than the CTE of substantially pure AlN at the same temperature. Accordingly, combination of the higher CTE second phase component with the lower CTE polycrystalline AlN can achieve a composite or alloy base substrate material having a CTE that is in the range between the CTE of the first and second phase materials. Of course, if a lower CTE is desired, the second phase material could have a CTE that is less than the CTE of the substantially pure AlN. It is understood, of course, that the invention is not limited to the use of only a second phase. Rather, three or even more phases could be combined (at least one phase being the AlN particles) to form a more complex mixture and have even greater control over the achieved CTE arising from the combination of materials.

In particular embodiments, the second phase material can be referred to as an additive material. The additive material preferably is a material that is chemically non-reactive with AlN such that the combination of the two (or more) materials achieves only a mixture without the creation of any new materials (e.g., reaction products). For example, one additive material that could be used according to the invention is titanium nitride (TiN). As reported in the literature, the CTE value of TiN at room temperature is approximately $9.2 \times 10^{-6}$ $K^{-1}$ (see Wokulska, K., 1998, *Journal of Alloys and Compounds*, 264, 223-227, which is incorporated herein by reference). With knowledge of the CTE of substantially pure AlN and the CTE of any additive materials to be used as the second (or more) phase, it is possible to calculate the necessary proportions of the respective materials used to form a composite or alloy polycrystalline AlN base material having a CTE that is closely matched to the CTE of the semiconductor growth layer material. For example, in embodiments where the growth layer is single crystal GaN (CTE~$4.0 \times 10^{-6}$ $K^{-1}$), it is possible to calculate the amount of TiN that would necessary for addition to the substantially pure AlN (CTE~$3.0 \times 10^{-6}$ $K^{-1}$), to achieve a composite composition having a CTE that is closely matched to the CTE of the GaN. Any material that can be combined with AlN in the above-described manner could be used as an additive material in place of or in addition to TiN.

In other embodiments, a composite or alloy polycrystalline AlN base substrate according to the invention may be thermally engineered such that the second phase (or further phases), rather than being an actual additive itself, can be the product of a reaction between the AlN and an additive (i.e., precursor) material. Specifically, the additive can be chosen so that reaction product will comprise one or more materials that have a CTE that is different than (e.g., greater than) the CTE of substantially pure AlN at the same temperature. For example, aluminum oxide ($Al_2O_3$) will react with AlN to form a complex phase equilibrium with many possible AlON phases. Thus, the final CTE of a combination of AlN and $Al_2O_3$ can be a function of the relative quantities of the end member phases and reaction phases present. Since the room temperature CTE of $Al_2O_3$ (approximately $7 \times 10^{-6}$ $K^{-1}$) is greater than the CTE of substantially pure AlN at the same temperature, the CTE of the final composite polycrystalline AlN base substrate can be adjusted to closely match the CTE of the growth layer that will be combined with the base substrate by controlling the relative concentrations of the components and thus controlling the relative quantities of the reaction products formed. In some embodiments where reaction products are formed, the composite base substrate can comprise substantially only AlN and the reaction products formed. In other embodiments, the composite base substrate can comprise AlN, the reaction products formed, and some content of the precursor additive that was used to form the reaction products. Any material that can be combined with AlN in the above-described manner could be used as an additive material in place of or in addition to $Al_2O_3$ to cause formation of reaction products and thus alter the CTE of the AlN base substrate.

A composite or alloy polycrystalline AlN base substrate according to the present invention can be engineered to have a CTE that closely matches virtually any material that may be uses as a semiconductor growth layer overlying the base substrate. For nitride-type semiconductors, the CTE of the composite or alloy polycrystalline AlN base substrate particularly can be in the range of about $4 \times 10^{-6}$ $K^{-1}$ to about $8 \times 10^{-6}$ $K^{-1}$ (averaged between room temperature and the temperature at which epitaxial growth of the device structure occurs). In some embodiments, it can be advantageous for the CTE of the composite or alloy polycrystalline AlN base substrate (averaged between room temperature and the temperature at which epitaxial growth of the device structure occurs) to be engineered to be equal to or greater than the CTE of GaN at substantially the same temperature. For example, the CTE of the composite or alloy polycrystalline AlN base substrate (averaged between room temperature and the temperature at which epitaxial growth of the device structure occurs) can exceed the CTE of GaN at the same temperature by about 1% to about 50%, about 1% to about 40%, about 1% to about 30%, about 1% to about 25%, about 1% to about 20%, about 2% to about 20%, about 3% to about 20%, about 4% to about 20%, or about 5% to about 20%.

As can be recognized from the foregoing, in addition to providing an intermediate substrate, the present invention also provides stand alone base substrates that can be provided for use in the preparation of further structures, including intermediate substrates and semiconductor materials. Thus, in specific embodiments, the invention can be characterized as providing a thermally engineered substrate. Such substrates can comprise a pressed and sintered multiphase material including polycrystalline aluminum nitride as a first phase.

Such thermally engineered substrates can be characterized by their customized CTE values that are different from the CTE of substantially pure AlN. Such different CTE value can be in the ranges already described above. Likewise, the thermally engineered substrates can be characterized by their customized CTE values that are closely matched to other types of materials. Again, such different CTE values can be in the ranges already described herein. The thermally engineered substrates also can be characterized by the total content of materials used therein.

In some embodiments, a thermally engineered substrate according to the present invention can comprise about 50% or greater, about 60% or greater, or about 70% or greater by weight AlN. In further embodiments, the substrates can comprise about 50% to about 99%, about 50% to about 98%, about 50% to about 97%, about 50% to about 96%, about 50% to about 95%, about 50% to about 90%, about 55% to about 90%, about 60% to about 90%, about 60% to about 85%, or about 65% to about 80% by weight AlN.

In other embodiments, the substrates can be characterized by the content of further phases present. For example, when using an additive that is not reactive with AlN as the second phase, such additive can be present in an amount of up to about 50%, up to a bout 45%, up to about 40%, up to about 35%, up to about 30%, up to about 35%, up to about 30%, up to about 25%, up to about 20%, up to about 15%, or up to about 10% by weight of the substrate. In further embodiments, the additive can comprise about 1% to about 50%, about 2% to about 48%, about 3% to about 45%, about 4% to about 40%, about 5% to about 40%, about 10% to about 40%, about 15% to about 40%, or about 20% to about 40% by weight of the substrate. When using an additive that reacts with AlN such that the reaction products are the second phase, such reaction products can be present in the above-noted amounts. In the foregoing embodiments, a substrate can be characterized as comprising a defined content of AlN, a defined content of an additive (or a reaction product), and a defined content of impurities. For example, impurities may account for up to about 2%, up to about 1.5%, up to about 1%, or up to about 0.5% by weight of the substrate. Such impurities may encompass unreacted additives. Thus, in some embodiments, the substrate may be described as consisting essentially of or consisting of a defined content of AlN, a defined content of an additive (or reaction product), and the remainder impurities (up to the noted amounts).

In light of the foregoing, it is seen that the present invention provides for a variety of useful materials. For example, in some embodiments, the invention provides a thermally engineered substrate comprising a multiphase material including polycrystalline aluminum nitride as a first phase, the substrate having a CTE that differs from the CTE of substantially pure aluminum nitride at the same temperature by an amount of about 10% or greater. The thermally engineered substrate can include, as a second phase, an additive material that is chemically non-reactive with aluminum nitride and that has a CTE that is greater than the CTE of substantially pure aluminum nitride at the same temperature. The second phase can comprise about 5% or greater by weight of the substrate. As an example, the second phase can comprise titanium nitride. In other embodiments, the substrate can include, as a second phase, the product of a reaction between aluminum nitride and an additive (i.e., precursor) material, the reaction product having a CTE that is greater than the CTE of substantially pure aluminum nitride at the same temperature. Again, the second phase can comprise about 5% or greater by weight of the substrate. As an example, second phase can comprise the product of a reaction between aluminum nitride and aluminum oxide. In further embodiments, the substrate can have a CTE that is within about 25% of the CTE of substantially pure gallium nitride at the same temperature. Specifically, the CTE of the substrate can exceed the CTE of substantially pure aluminum nitride at the same temperature by an amount of about 10% or greater.

In other embodiments, the invention provides an intermediate substrate for growth of a semiconductor material thereon. The intermediate substrate can comprise a semiconductor growth layer overlying a polycrystalline aluminum nitride base substrate that is thermally matched to the growth layer. Specifically, the semiconductor growth layer and the polycrystalline aluminum nitride base substrate each can have a CTE that is different than the CTE of substantially pure polycrystalline aluminum nitride at the same temperature. Further, the CTE of the polycrystalline aluminum nitride base substrate can exceed the CTE of substantially pure polycrystalline aluminum nitride at the same temperature by an amount of about 10% or greater. In other embodiments, the CTE of the polycrystalline aluminum nitride base substrate can be within about 25% of the CTE of the semiconductor growth layer at the same temperature. Specifically, the semiconductor growth layer can comprise a Group III-Nitride, for example, gallium nitride. The semiconductor growth layer can comprise a single crystal material. In some embodiments, the polycrystalline aluminum nitride base substrate can comprise a polycrystalline aluminum nitride as a first phase component and further comprises a second phase component. For example, the second phase can comprise an additive material that is chemically non-reactive with aluminum nitride and that has a CTE that is greater than the CTE of substantially pure aluminum nitride at the same temperature. Specifically, the additive material can comprise titanium nitride, and the titanium nitride can comprise about 5% or greater by weight of the base substrate. Alternatively, the second phase can comprise the product of a reaction between aluminum nitride and an additive material, the reaction product having a CTE that is greater than the CTE of substantially pure aluminum nitride at the same temperature. Specifically, the reaction product can be the product of reaction between aluminum nitride and aluminum oxide. In some embodiments, the intermediate substrate further can comprise one or more additional layers positioned between the semiconductor growth layer and the polycrystalline aluminum nitride base substrate or positioned overlying the semiconductor growth layer.

The invention specifically can encompass a device comprising an intermediate substrate as described herein. For example, the device can be selected from the group consisting of electronics, optronics, and optoelectronics. More specifically, the device can be selected from the group consisting of light emitting diodes, laser diodes, high electron mobility transistors (HEMT), heterostructure bipolar transistors (HBT), radio frequency circuits, microwave circuits, radio frequency power amplifiers, high voltage switching devices, photodetectors, solar cells, spin transport electronics, metal oxide semiconductor field effect transistors, metal semiconductor field effect transistors, and integrated logic/compound semiconductor devices. In other embodiments, the device can be selected from the group consisting of color displays, traffic lights, automotive lights, aerospace lights, commercial and residential lights, infrared remote devices, image scanners, video devices, photography devices, sensors, touch screens, ultraviolet disinfection and sterilization devices, ultraviolet curing devices, printers, machine vision devices, high-density optical storage disks, and magnetoresistive random access memory devices.

In relation to the foregoing structures, the invention advantageously provides methods for preparing a polycrystalline aluminum nitride substrate that is useful for growth of a semiconductor material thereon. In certain embodiments, the methods allow for thermally engineering the substrate to have a CTE that sufficiently differs from the CTE of substantially pure AlN so as to be closely matched to the CTE of a second material that can be used as a semiconductor growth layer and that can be attached to the polycrystalline AlN substrate as part of the same or a different process. The methods further allow for thermally engineering the substrate to have a CTE that is closely matched to the CTE of an actual semiconductor material or layer that may be grown on the AlN substrate (or on a layer overlying the AlN substrate).

In some embodiments, a method according to the invention for preparing a polycrystalline AlN substrate can comprise combining substantially pure aluminum nitride (which may be considered to be a "first phase" material or first phase particles) with a content of a second phase material that is different from the substantially pure aluminum nitride. In certain embodiments, the second phase material preferably has a CTE that is greater than the CTE of the substantially pure AlN particles at the same temperature. The combined materials then can be subjected to desired processing conditions to form the final product. For example, such processing may comprise pressing in order to form a pressed slug of a sintered multiphase AlN material having a CTE that is greater than the CTE of substantially pure AlN at the same temperature. In some embodiments, the methods further can comprise sintering the pressed slug to form a sintered multiphase AlN material having a CTE that is greater than the CTE of substantially pure AlN at the same temperature.

In other embodiments, a method according to the invention for preparing a polycrystalline AlN substrate can comprise combining first phase substantially pure AlN with a content of a second phase material, which is the reaction product of the AlN with a precursor material. The second phase material reaction product specifically can be different from the substantially pure AlN or the precursor material. The precursor material may be in any form (e.g., powder, particles, or even liquid) suitable for combination with the substantially pure AlN to facilitate reaction therewith. Preferably, the second phase material reaction product that is formed is a solid material that has a CTE that is different than (e.g., greater than) the CTE of the substantially pure aluminum nitride. As before, the combination of the substantially pure AlN and the second phase material can be pressed to form a pressed slug. The pressed slug also can be sintered to form a sintered multiphase AlN material having a CTE that is different than the CTE of substantially pure AlN at the same temperature. In particular embodiments, the precursor material can react with the AlN particles during sintering to form the second phase reaction product having the CTE that is different than the CTE of substantially pure AlN. The sintered multiphase AlN material can comprise AlN, the one or more reaction products, and any unreacted precursor material remaining, if applicable. While reaction is expected to occur mainly during the sintering step, the invention likewise encompasses the use of second phase materials where reaction of the precursor material (in part or in whole) can occur prior to any sintering step (e.g., during pressing). Thus, in some embodiments, reaction to form the second phase reaction products may occur in the combining step and/or any further processing steps, such as pressing step and/or a sintering step. A sintered multiphase AlN material can be essentially a polycrystalline AlN base substrate as otherwise described above and can exhibit the specific properties described herein in relation to the a polycrystalline AlN base substrate, particularly CTE values relative to other materials.

In some embodiments, if desired, the processing methods of the invention can comprise steps useful to facilitate formation of a highly dense aluminum nitride substrate and/or to facilitate formation of substrates with particularly desirable surface morphology. For example, in some embodiments, the methods may exclude the use of specific materials, such as binders and/or sintering aids.

In part because of the specific methods of preparation described herein, the present invention can allow for the use of a second phase material that is selected to specifically engineer the composition CTE. Thus, the methods described herein can allow for the use of temperatures in excess of what may be disclosed in the art and thus can forego the typical use of sintering aids, if desired.

The inventive methods also can be advantageous because of the ability to closely control surface roughness of the polycrystalline AlN base substrate. Previously known methods of preparing a polycrystalline AlN base substrate can result in porosities that cause unacceptable surface roughness, particularly on a nanometer scale.

In determining an rms roughness for a given surface, the surface topography can be represented as a surface profile, z(x). Surface topography is generally a series of peaks and valleys deviating by a certain distance from a mean line. The greater the distance of the peaks and valleys from the mean line, the rougher the surface. In the surface profile, z represents the distance from the mean line at a specific point along the line on the surface being measured, and x represents the number of measurements evaluated to determine rms roughness along the line. Accordingly, rms roughness (Rq) is defined as the root mean square of the deviations of the surface profile, z(x), from the mean line. This is calculated according to the following equation:

$$Rq = \left[\frac{1}{L}\int_0^L z^2(x)\,dx\right]^{1/2}$$

where L is the length of the surface profile along the x-direction. The rms roughness is generally designated by Rq in documentary standards and is often represented in certain fields, such as optics, by the symbol σ. Because surface profiles z(x) are closely approximated in nearly all modern instruments by a digitized set of points $z_i$, the above equation can be replaced in practice by its digital equivalent:

$$Rq = \left[\frac{1}{N}\sum_{i=1}^{N} z_i^2\right]^{1/2}$$

where N is the number of data points in a measured surface profile.

Various profiling techniques are available that are capable of measuring surface roughness in a nanometer scale. Examples of such techniques include stylus-based profiling, phase-shifting interferometric microscopy, Nomarski profiling, and atomic force microscopy (AFM). Of these methods, AFM is often recognized as producing the highest lateral resolution, generally of 1 nm or less. Surface roughness evaluation is further described by Vorburger, T, Fu, J., and Orji, N., "In the Rough", SPIE's oe Magazine, 2(3), March 2002, p. 31-34, which is incorporated, herein by reference. One example of a device useful in calculating runs roughness is a Dektak 150 Surface Profiler (available from Veeco Instruments, Inc., Plainview, N.Y.).

In specific embodiments, rms roughness may be determined across a defined sampling area. In one embodiment, the sampling area may have dimensions of about 1,000 μm×200 μm. Sampling size may vary, but it is preferable that the sampling size be consistent between different samples to ensure a standard characterization of roughness. In some embodiments, sampling size may encompass an area of about 50 mm² to about 500 mm², about 100 mm² to about 300 mm², or about 150 mm² to about 250 mm².

In specific embodiments, the polycrystalline AlN base substrates can exhibit an rms roughness that is about 100 nm or less, about 90 nm or less, about 80 nm or less, about 70 nm or less, about 60 nm or less, about 50 nm or less, about 40 nm or less, about 30 nm or less, about 20 nm or less, about 15 nm or less, or about 10 nm or less. In specific embodiments, rms surface roughness can be about 5 nm to about 75 nm, about 5 nm to about 50 nm, about 5 nm to about 25 nm, or about 10 nm to about 25 nm.

In other embodiments, the polycrystalline AlN base substrates can be characterized in terms of pit density. A "pit" at the surface of a substrate as described herein is understood to relate to an undesirable depression having a bottom surface that is vertically lower than the surrounding area of the substrate surface (i.e., is depressed to be lower than the surrounding, average surface). The "pit" further can be defined as being contiguous and as being laterally defined (i.e., as having walls rising up from the bottom surface and terminating at an interface with the surround area of the substrate surface). Quantitatively, a pit according to the invention can be defined in terms of its depth (i.e., distance from the bottom surface of the pit to the surrounding, average surface of the substrate) and its width (i.e., the minimum distance across the pit at the level of the surrounding, average surface of the substrate). In specific embodiments, a pit can be defined as any depression in the substrate surface as defined above having a depth of about 0.2 µm or greater, about 3 µm or greater, about 4 µm or greater, or about 5 µm or greater. A pit also can be defined as any depression in the substrate surface as defined above having a width of about 0.5 µm or greater, about 0.8 µm or greater, about 1 µm or greater, about 1.5 µm or greater, or about 2 µm or greater. In specific embodiments, a pit can be defined by specific combinations of the depths and widths provided above.

In light of the foregoing, the pit density at the substrate surface can be calculated. Pit density thus can be defined as a measure of the number of pits in the substrate surface over a defined area (e.g., number of pits per square cm). In certain embodiments, polycrystalline aluminum nitride substrates according to the present invention can have a pit density of about 100,000 $cm^{-2}$ or less, about 50,000 $cm^{-2}$ or less, about 25,000 $cm^{-2}$ or less, about 10,000 $cm^{-2}$ or less, about 5,000 $cm^{-2}$ or less, about 4,000 $cm^{-2}$ or less, about 3,000 $cm^{-2}$ or less, about 2,000 $cm^{-2}$ or less, about 1,000 $cm^{-2}$ or less, about 800 $cm^{-2}$ or less, about 600 $cm^{-2}$ or less, or about 500 $cm^{-2}$ or less.

Pit density can be measured using any suitable technique in the art for revealing surface topography with sufficient lateral and vertical resolution. Non-limiting examples include AFM, profilometry, optical interferometry (e.g., differential interference contrast (DIC) microscopy), and the like. Combinations of such methods also could be used.

The AlN base substrate also can be prepared so as to be substantially flat (i.e., lacking any warps or bends). Specifically, the flatness of the polycrystalline AlN base substrate can be such that the amount of warp across the substrate is about 0.2% or less, about 0.15% or less, about 0.1% or less, about 0.05% or less, or about 0.02% or less of the substrate diameter. Warp can be defined as the sum of the maximum positive and maximum negative deviation of the substrate top surface from a reference, perfectly flat plane that intersects the substrate top surface.

In some embodiments, it can be beneficial to form the AlN base substrate using AlN powders having a specific particle size. In some embodiments, the AlN powders can have a particle size of about 10 microns or less, about 9 microns or less, about 8 microns or less, about 7 microns or less, about 6 microns or less, about 5 microns or less, about 4 microns or less, about 3 microns or less, or about 2 microns or less. In other embodiments, the particle size can be in the range of about 0.1 microns to about 10 microns, about 0.2 microns to about 8 microns, about 0.5 microns to about 5 microns, or about 0.5 microns to about 2 microns. In specific embodiments, the particles may have a defined particle size distribution. For example, the AlN powder may be characterized such that about 50% or greater, about 60% or greater, about 70% or greater, about 80% or greater, about 90% or greater, about 95% or greater, or about 99% or greater of the particles have a size in a range defined above. In other embodiments, the AlN powder may be characterized such that about 50% or greater, about 60% or greater, about 70% or greater, about 80% or greater, about 90% or greater, about 95% or greater, or about 99% or greater of the particles have a size that varies by less than about 5 microns or less, about 4 microns or less, about 3 microns or less, about 2 microns or less, or about 1 micron or less.

Although any pressing method known to be useful in preparing polycrystalline materials may be used according to the invention, it can be particularly beneficial for the pressing step to be carried out under specifically defined conditions. For example, pressing can comprise a method wherein no external heat is applied (i.e., the method is not a hot press sintering method). Of course, it is understood that some heat may be generated internally from the compression of the powders. Preferably, the pressing step is carried out such that the applied temperature is about 50° C. or less, about 40° C. or less, about 30° C. or less, or about 25° C. or less. In specific embodiments, the pressing step can be described as being carried out at ambient temperature although the actual heat of the pressed material inherent to the pressing action may exceed ambient temperature.

In certain embodiments, the pressing method can comprise applying a maximum pressure of about 20,000 PSI (138 MPa) or greater, about 25,000 PSI (172 MPa) or greater, about 30,000 PSI (207 MPa) or greater, about 35,000 PSI (241 MPa) or greater, or about 40,000 PSI (276 MPa) or greater. In specific embodiments, the maximum pressure applied can be in the range of about 20,000 PSI to about 40,000 PSI, about 25,000 PSI to about 35,000 PSI, or about 30,000 PSI to about 35,000 PSI. Such maximum pressure may be achieved at various rates. In specific embodiments, pressure can be applied such that the maximum pressure can be achieved in a time of about 30 minutes or less, about 25 minutes or less, about 20 minutes or less, or about 10 minutes or less. In other embodiments, the time to achieving maximum pressure may be in the range of about 2 minutes to about 20 minutes, about 5 minutes to about 15 minutes, or about 5 minutes to about 10 minutes. In further embodiments, pressure may be applied at a rate of about 1,000 PSI/minute (7 MPa/minute), about 2,000 PSI/minute (14 MPa/minute), about 3,000 PSI/minute (21 MPa/minute), about 4,000 PSI/minute (28 MPa/minute), about 5,000 PSI/minute (34 MPa/minute), about 6,000 PSI/minute (41 MPa/minute), about 7,000 PSI/minute (48 MPa/minute), or about 8,000 PSI/minute (55 MPa/minute).

In certain embodiments, the maximum pressure may be maintained for a time of about 1 hour or less, about 45 minutes or less, about 30 minutes or less, about 15 minutes or less, about 10 minutes or less, about 5 minutes or less, about 2 minutes or less, or about 1 minute or less. In some embodiments, the pressure is released immediately upon reaching the maximum pressure (i.e., is released in a time of about 30 seconds or less, about 20 seconds or less, about 10 seconds or less, or about 5 seconds or less after reaching the maximum pressure). The pressure may be released from the maximum to ambient (e.g., approximately atmospheric pressure) in a relatively short time, such as a time of about 10 minutes or less, about 9 minutes or less, about 8 minutes or less, about 7 minutes or less, about 6 minutes or less, about 5 minutes or less, about 4 minutes or less, about 3 minutes or less, about 2 minutes or less, or about 1 minute or less.

In specific embodiments, the pressing may be carried out using a cold isostatic press. Cold isostatic pressing typically applies pressure from multiple directions for achieving greater uniformity of compaction and increased shape capability, compared to uniaxial pressing. In one method of carrying out isostatic pressing known as wet-bag isostatic pressing, powder is encased in a rubber sheath that is immersed in a liquid which transmits the pressure uniformly to the powder. In another method known as dry-bag isostatic pressing, rather than immersing the tooling in a fluid, the tooling itself is built with internal channels into which high-pressure fluid is pumped.

In specific embodiments, the sintering step is "binderless" sintering in that no binding aid or sintering aid is included. In some embodiments, however, the second phase that is added to the AlN particles to alter the CTE thereof may comprise some content of a material that could be considered to be a binder in the art.

In specific embodiments, sintering can be carried out in a non-oxidizing atmosphere (e.g., substantially or completely void of any oxidizing gases, such as $O_2$). In some embodiments, it can be useful to provide an artificial atmosphere in the sintering chamber that comprises one or more non-oxidizing gases (e.g., noble gases, nitrogen gas, or any other gas that would not unfavorably react with the aluminum nitride material being sintered). The non-oxidizing gas can be filled into the sintering chamber to a specific pressure, such as up to about 5 atm (3,800 Torr), up to about 4 atm (3,040 Torr), up to about 3 atm (2,280 Torr), up to about 2 atm (1,520 Torr), up to about 1.5 atm (1,140 Torr), up to about 1.25 atm (950 Torr), or up to about 1.1 atm (836 Torr). In certain embodiments, the non-oxidizing gas is provided at a pressure of about 1 atm (760 Torr). In further embodiments, it is possible to carry out the process at lower pressures (i.e., under vacuum). The non-oxidizing gas can be provided at a specific flow rate throughout the sintering process or at only defined periods during the sintering process. Specifically, the non-oxidizing gas can be provided at a rate of about 10 standard cubic centimeters per minute (SCCM) to about 1,000 SCCM, about 25 SCCM to about 750 SCCM, about 50 SCM to about 500 SCCM, about 50 SCCM to about 250 SCCM, about 50 SCCM to about 150 SCCM, or about 75 SCCM to about 125 SCCM. In some embodiments, the process may be carried out with substantially no flow (i.e., a stagnant gas atmosphere).

Sintering can be carried out at a temperature sufficient to complete transformation of the pressed materials into a single, unified structure. For example, the pressed slug may be heated to a maximum temperature that is about 1,500° C. or greater, about 1,600° C. or greater, about 1,700° C. or greater, about 1,800° C. or greater, about 1,900° C. or greater, about 2,000° C. or greater, about 2,100° C. or greater, or about 2,200° C. In some embodiments, the maximum sintering temperature is in the range of about 1,500° C. to about 2,500° C., about 1,600° C. to about 2,500° C., about 1,700° C. to about 2,500° C., about 1,800° C. to about 2,500° C., about 1,900° C. to about 2,500° C., about 2,000° C. to about 2,500° C., about 2,100° C. to about 2,500° C., or about 2,100° C. to about 2,400° C. The temperature may be raised to the maximum in a step-wise manner with one or more soaks at a defined temperature for a defined period of time. Soaks may last about 5 minutes to about 5 hours, about 10 minutes to about 4 hours, about 15 minutes to about 3 hours, about 30 minutes to about 2 hours, or about 30 minutes to about 1.5 hours. The slug may be maintained at the maximum temperature for a time of about 1 hour to about 24 hours, about 2 hours to about 22 hours, about 3 hours to about 20 hours, about 4 hours to about 18 hours, about 5 hours to about 16 hours, about 6 hours to about 14 hours, about 7 hours to about 13 hours, about 8 hours to about 12 hours, or about 9 hours to about 11 hours. In further embodiments, the slug can be maintained at the maximum temperature for a time of about 2 hours or greater, about 3 hours or greater, about 4 hours or greater, about 5 hours or greater, about 6 hours or greater, about 7 hours or greater, about 8 hours or greater, or about 9 hours or greater.

In specific embodiments, the method may comprise the use of hot isostatic pressing. Such process step can comprise subjecting the materials to both elevated temperature and isostatic pressure (e.g., gas pressure) in a high pressure containment vessel. Any inert gas may be used in gas pressure processes, such as argon or $N_2$. The pressure, which preferably is applied from all direction, can be applied (e.g., with gas pumping) or can arise inherently from the heating of the chamber. When hot isostatic pressing is used, any combination of the pressure and temperature ranges described above in relation to the separate pressing and sintering steps may be used. In some embodiments of hot isostatic pressing, lower temperatures may be used, such as about 300° C. to about 1,500° C., about 400° C. to about 1,400° C., or about 500° C. to about 1,300° C. Such use of hot isostatic pressing may be carried out in addition to or in place of the sintering steps otherwise described above. In such embodiments, it is understood that further discussion herein of a "sintered" AlN material would also apply to materials that were considered to be sintered via hot isostatic pressing.

In still further embodiments, methods of preparing an AlN base substrate according to the invention can comprise the use of methods recognized as spark plasma sintering ("SPS"), field assisted sintering technique ("FAST"), or pulsed electric current sintering ("PECS"). Such process can comprise uniaxially pressing the AlN powder and the CTE adjusting material at an elevated temperature while applying an electric field (typically pulsed DC current). Since the current directly passes through the die and the AlN power, the heat is generated internally. This can facilitate a very high heating rate (e.g., up to 1,000 K/min). Such process can be beneficial to consolidate the AlN powder and additive into a nearly fully dense compact in one single and relatively fast processing step. Moreover, the SPS-processed material can have a particularly low void density. Again, SPS can be used in addition to or in place of sintering and/or hot isostatic pressing described above. In specific embodiments, SPS processing could be used as an alternative to any or all of pressing, sintering, and hot isostatic pressing.

In some embodiments, the sintered, multiphase polycrystalline AlN material can be subjected to one or more shaping steps. For example, the sintered material may be ground to a desired shape (e.g., a cylinder) as would be useful for forming the base substrate. The sintered material also may be cut into one or more substantially uniform divisions (e.g., wafers). The sintered material (either in the bulk form removed from the sintering step or in a processed state as described above— e.g., in the form of a wafer with substantially flat, opposing surfaces) can be subjected to a lapping and/or polishing step, such as mechanical lapping and/or mechanical polishing. Lapping and/or polishing preferably results in a base substrate having a surface morphology in line with the characteristics previously described herein.

In addition to the foregoing methods for preparing a multiphase polycrystalline AlN base substrate, the present invention also provides methods for the preparation of an intermediate substrate for growth of a semiconductor material therein. Such methods make use of polycrystalline AlN base substrates, as otherwise described herein, that have CTE values that are sufficiently different from the CTE values of substantially pure AlN so as to be thermally matched to a semiconductor growth layer formed of a material different from substantially pure AlN.

In certain embodiments, a method of preparing an intermediate substrate for growth of a semiconductor material thereon can comprise providing a polycrystalline AlN base substrate having a CTE that is different than the CTE of substantially pure polycrystalline AlN at the same temperature. In specific embodiments, the polycrystalline AlN base substrate can have a CTE that is different than the CTE of substantially pure polycrystalline AlN at the same temperature. The method can comprise overlaying a semiconductor growth layer on the base substrate.

In various embodiments, the polycrystalline AlN base substrate can comprise a multiphase AlN material as otherwise described herein. Preferably, the polycrystalline AlN base substrate is a base substrate that has been thermally engineered to closely match the CTE of the semiconductor growth layer that is overlaid thereon and/or a semiconductor material that can be grown on the growth layer that is overlaid thereon.

The semiconductor growth layer can be a source (or "donor") semiconductor substrate or wafer that functions as a template for growth of one or more semiconductor layers thereon. In specific embodiments, the semiconductor growth layer can comprise a GaN single crystal or any other material otherwise described herein. Such growth layers can be formed by any useful means recognized in the art prior to transfer to the CTE matched AlN base substrate described herein. For example, layers of GaN or $Al_zGa_{1-z}N$ materials (where z is in the range of 0 to 1) may be grown homoepitaxially on high-quality low-defect-density freestanding commercial GaN or AlN substrates or may be grown heteroepitaxially on sapphire or SiC substrates prior to transfer to the polycrystalline AlN base substrate. Any material suitable for use as an epitaxial template for a Group III-nitride semiconductor system may be applied to a base substrate as a growth layer. In certain embodiments, the growth layer can be a single crystal layer or a layer with a highly oriented columnar structure which has a surface lattice structure that is similar to the lattice structure of the desired compound semiconductor material to be grown thereon. For example, a Group III-nitride compound material can be useful to allow epitaxial growth of a single crystal layer of a Group III-nitride compound semiconductor material thereon. As previously noted, the growth layer can comprise any combination of Group III and Group V elements, particularly Group III-Nitride materials, and can include any of the following: GaN, AlN, AlGaN, InGaN, InN, InAlGaN, AlInN, AlGaAs, GaP, GaAs, GaAsP, and AlGaInP, particularly single crystal GaN.

As previously noted, one or more optional, additional layers may be deposited on the polycrystalline AlN base substrate prior to transferring the semiconductor growth layer thereon. In some embodiments, such layers may be useful to facilitate bonding of the growth layer to the base substrate. In other embodiments, an encapsulating layer may be provided to protect the base substrate from further processing steps, such as epitaxial growth methods. Depending upon the material used as the additive to alter the CTE of the polycrystalline AlN base substrate, it may be useful to provide a diffusion barrier layer between the base substrate and the growth layer.

The semiconductor growth layer can be attached to the base substrate by any suitable methods. For example, bonding can be achieved by direct bonding, by bonding with optional bonding layers, or by any other known techniques, such as disclosed by Q.-Y. Tong and U. Gosele, *Semiconductor Wafer Bonding*, Wiley and Sons, 1999, the disclosure of which is incorporated herein by reference. In other embodiments, bonding of the growth layer to the base substrate may be achieved through use of a bonding agent without the inclusion of any intervening layers.

In other embodiments, the invention can provide methods of preparing a semiconductor material. Such semiconductor material may be a complete device or may be a component of a larger device. The semiconductor material may be referred to as a semiconductor structure.

More specifically, a method of preparing a semiconductor material according to the invention can comprise providing an intermediate substrate as described herein and growing a semiconductor layer thereon. For example, the intermediate substrate can be formed of a semiconductor growth layer that is bonded to or otherwise associated with a multiphase, polycrystalline AlN base substrate that is thermally matched to the semiconductor growth layer and/or the semiconductor layer that will be grown on the growth layer. In specific embodiments, the base substrate can have a CTE that is different than (e.g., greater than) the CTE of substantially pure polycrystalline AlN at the same temperature. The method can comprise growing multiple semiconductor layers or only a single layer. Further, the methods can comprise addition of further layers over the semiconductor growth layer, including materials that are not considered semiconductors. In specific embodiments, the further layers can comprise components necessary to form specific devices or provide specific properties.

In some embodiments, the methods can be characterized as providing for growth of crystalline films of a semiconducting material on the intermediate substrates of the invention (which may be referred to as laminate structures). Growth of a semiconductor layer can be carried out using any suitable technique, such as chemical vapor deposition (CVD), metalorganic chemical vapor deposition (MOCVD), molecular beam epitaxy (MBE), hydride vapor phase epitaxy (HYPE), and ion beam assisted deposition (IBAD). Suitable growth equipment that may be used in such methods include, but are not limited to, an electron beam evaporator, a physical vapor deposition device, a chemical vapor deposition device, a plasma laser deposition device, a dual-type thermal evaporator, a sputtering device, or a metal organic chemical vapor deposition device.

In other embodiments, the invention can comprise growth of semiconductor materials using a growth material that does not include a base substrate. For example, a method according to the invention can comprise the following steps: preparing a multiphase, polycrystalline AlN base substrate as described herein, that is thermally engineered to have a CTE that is different than the CTE of substantially pure AlN and that is closely matched to the CTE of a layer to be attached to or grown on the base substrate; attaching to the base substrate a semiconductor growth layer; growing at least one semiconductor material layer on the growth layer; and removing from the semiconductor material layer one or both of the base substrate and the growth layer.

The materials and methods of the present invention can be used in a variety of manners in relation to the preparation of functioning devices. For example, the materials and methods can be used in the preparation of electronic devices, optronic devices, and optoelectronic devices. In specific devices, the invention can relate to light emitting diodes (e.g., for use in any article of manufacture where a light source can be desired) and laser diodes (e.g., for use in laser disc read/write technology, including video and gaming technology). In further embodiments, the invention can relate to Group III-nitride based transistors, such as high electron mobility transistors (HEMT) and heterostructure bipolar transistors (HBT). Such devices are useful in radio frequency (RF) and microwave circuits. Still further embodiments of the invention can relate to RF power amplifiers (e.g., in wireless data transmission), high voltage switching devices for power grids, photodetectors, solar cells, spin transport electronics (or "spintronics") including magnetoresistive random access memory devices, metal oxide semiconductor field effect transistors (MESFET), metal semiconductor field effect transistors (MESFET), and integrated logic/compound semiconductor devices. More specific articles of manufacture encompassed by the invention incorporating semiconductor devices as described herein and/or prepared according to a method described herein can be selected from the group consisting of color displays (e.g., text and video displays), traffic lights, automotive lighting, aerospace lighting, commercial lighting, residential lighting, infrared remote devices, image scanners, video devices, photography devices, sensors (such as in medical equipment, computing devices, and gaming devices), touch screens, ultraviolet disinfection and sterilization devices, ultraviolet curing devices, printers, machine vision devices (e.g., barcode scanners), and high-density optical storage disks.

Many modifications and other embodiments of the invention will come to mind to one skilled in the art to which this invention pertains having the benefit of the teachings presented in the foregoing descriptions and associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A thermally engineered substrate comprising a multiphase material including polycrystalline aluminum nitride as a first phase, the substrate having a coefficient of thermal expansion (CTE) that differs from the CTE of substantially pure aluminum nitride at the same temperature by an amount of about 10% or greater.

2. The thermally engineered substrate of claim 1 including, as a second phase, an additive material that is chemically non-reactive with aluminum nitride and that has a CTE that is greater than the CTE of substantially pure aluminum nitride at the same temperature.

3. The thermally engineered substrate of claim 2, wherein the second phase comprises about 5% or greater by weight of the substrate.

4. The thermally engineered substrate of claim 2, wherein the second phase comprises titanium nitride.

5. The thermally engineered substrate of claim 1 including, as a second phase, the product of a reaction between aluminum nitride and a precursor material, the reaction product having a CTE that is greater than the CTE of substantially pure aluminum nitride at the same temperature.

6. The thermally engineered substrate of claim 5, wherein the second phase comprises about 5% or greater by weight of the substrate.

7. The thermally engineered substrate of claim 5, wherein the second phase comprises the product of a reaction between aluminum nitride and aluminum oxide.

8. The thermally engineered substrate of claim 1, wherein the substrate has a CTE that is within about 25% of the CTE of substantially pure gallium nitride at the same temperature.

9. The thermally engineered substrate of claim 1, wherein the CTE of the substrate exceeds the CTE of substantially pure aluminum nitride at the same temperature by an amount of about 10% or greater.

10. The thermally engineered substrate of claim 1, further comprising a semiconductor growth layer overlying the thermally engineered substrate, wherein the thermally engineered substrate has a CTE such that the thermally engineered substrate is thermally matched to the semiconductor growth layer.

11. The thermally engineered substrate of claim 10, wherein the semiconductor growth layer has a CTE that differs from the CTE of substantially pure polycrystalline aluminum nitride at the same temperature by an amount of about 10% or greater.

12. The thermally engineered substrate of claim 11, wherein the CTE of the semiconductor growth layer and the CTE of the polycrystalline aluminum nitride base substrate both exceed the CTE of substantially pure polycrystalline aluminum nitride at the same temperature by an amount of about 10% or greater.

13. The thermally engineered substrate of claim 10, wherein the CTE of the thermally engineered substrate is within about 25% of the CTE of the semiconductor growth layer at the same temperature.

14. The thermally engineered substrate of claim 10, wherein semiconductor growth layer comprises a Group III-Nitride.

15. The thermally engineered substrate of claim 14, wherein the semiconductor growth layer comprises a gallium nitride.

16. The thermally engineered substrate of claim 14, wherein the semiconductor growth layer comprises a single crystal material.

17. The thermally engineered substrate of claim 10, further comprising one or more additional layers positioned between the semiconductor growth layer and the thermally engineered substrate or positioned overlying the semiconductor growth layer.

18. A device comprising a thermally engineered substrate according to claim 10.

19. The device of claim 18, wherein the device is selected from the group consisting of electronics, optronics, and optoelectronics.

20. The device of claim 18, wherein the device is selected from the group consisting of light emitting diodes, laser diodes, high electron mobility transistors (HEMT), heterostructure bipolar transistors (HBT), radio frequency circuits, microwave circuits, radio frequency power amplifiers, high voltage switching devices, photodetectors, solar cells, spin transport electronics, metal oxide semiconductor field effect transistors, metal semiconductor field effect transistors, and integrated logic/compound semiconductor devices.

21. The device of claim 18, wherein the device is selected from the group consisting of color displays, traffic lights, automotive lights, aerospace lights, commercial and residential lights, infrared remote devices, image scanners, video devices, photography devices, sensors, touch screens, ultraviolet disinfection and sterilization devices, ultraviolet curing devices, printers, machine vision devices, high-density optical storage disks, and magnetoresistive random access memory devices.

22. The thermally engineered substrate of claim 1, wherein the multiphase material is a pressed and sintered material.

23. A method of preparing a thermally engineered polycrystalline aluminum nitride substrate for growth of a semiconductor material thereon, the method comprising:
combining a first phase aluminum nitride with a content of a second phase material having a coefficient of thermal expansion (CTE) that is different than the CTE of the aluminum nitride; and
further processing the combined first and second phases to form a multiphase aluminum nitride material having a CTE that is different than the CTE of substantially pure aluminum nitride at the same temperature.

24. The method of claim 23, wherein said further processing comprises
pressing the aluminum nitride and the second phase material to form a pressed slug; and
sintering the pressed slug to form a sintered multiphase aluminum nitride material having a CTE that is different than the CTE of substantially pure aluminum nitride at the same temperature.

25. The method of claim 24, wherein said pressing is carried out in the absence of any applied heat.

26. The method of claim 24, wherein said sintering step is carried out in a chamber that is evacuated of ambient gases.

27. The method of claim 26, wherein said sintering step is carried out in an N₂ atmosphere.

28. The method of claim 24, further comprising polishing at least one surface of the sintered multiphase aluminum nitride material.

29. The method of claim 23, wherein the multiphase aluminum nitride material has a CTE that exceeds the CTE of substantially pure aluminum nitride at the same temperature by an amount of about 10% or greater.

30. The method of claim 23, wherein the multiphase aluminum nitride material has a CTE that is within about 25% of the CTE of a Group III-Nitride material other than substantially pure aluminum nitride at the same temperature.

31. The method of claim 30, wherein the Group III-Nitride material comprises gallium nitride.

32. The method of claim 23, wherein the second phase comprises titanium nitride.

33. The method of claim 32, wherein the titanium nitride comprises about 5% or greater by weight of the thermally engineered polycrystalline aluminum nitride substrate.

34. The method of claim 23, wherein the second phase material is the reaction product of a precursor material that reacts with aluminum nitride to form the reaction product, the reaction product having a CTE that is different than the CTE of the aluminum nitride particles.

35. The method of claim 34, wherein the reaction product is the product of reaction between aluminum nitride and aluminum oxide.

36. A method of preparing an intermediate substrate for growth of a semiconductor material thereon, the method comprising:
overlaying a semiconductor growth layer on a thermally engineered polycrystalline aluminum nitride substrate prepared according to the method of claim 23;
wherein the CTE of the thermally engineered polycrystalline aluminum nitride substrate is within about 25% of the CTE of the semiconductor growth layer at the same temperature.

37. The method of claim 36, wherein the semiconductor growth layer comprises a material selected from the group consisting of GaN, AJGaN, InGaN, InN, InAlGaN, AlInN, AlGaAs, GaP, GaAs, GaAsP, and AlGaInP.

38. The method of claim 36, wherein the semiconductor growth layer comprises a Group III-Nitride.

39. The method of claim 36, wherein the semiconductor growth layer comprises a single crystal material.

40. The method of claim 36, further comprising providing one or more additional layers positioned between the semiconductor growth layer and the polycrystalline aluminum nitride base substrate or positioned overlying the semiconductor growth layer.

41. A method of preparing a semiconductor material comprising:
growing a semiconductor layer on an intermediate substrate prepared according to the method of claim 36.

42. The method of claim 41, further comprising growing one or more further layers on the semiconductor layer.

43. A device comprising a semiconductor material prepared according to the method of claim 41.

44. The device of claim 43, wherein the device is selected from the group consisting of electronics, optronics, and optoelectronics.

45. The device of claim 43, wherein the device is selected from the group consisting of light emitting diodes, laser diodes, high electron mobility transistors (HENT), heterostructure bipolar transistors (HBT), radio frequency circuits, microwave circuits, radio frequency power amplifiers, high voltage switching devices, photodetectors, solar cells, spin transport electronics, metal oxide semiconductor field effect transistors, metal semiconductor field effect transistors, and integrated logic/compound semiconductor devices.

46. The device of claim 43, wherein the device is selected from the group consisting of color displays, traffic lights, automotive lights, aerospace lights, commercial and residential lights, infrared remote devices, image scanners, video devices, photography devices, sensors, touch screens, ultraviolet disinfection and sterilization devices, ultraviolet curing devices, printers, machine vision devices, high-density optical storage disks, and magnetoresistive random access memory devices.

* * * * *

UNITED STATES PATENT AND TRADEMARK OFFICE
CERTIFICATE OF CORRECTION

PATENT NO.          : 8,766,274 B2
APPLICATION NO.     : 13/324261
DATED               : July 1, 2014
INVENTOR(S)         : Spalding Craft et al.

It is certified that error appears in the above-identified patent and that said Letters Patent is hereby corrected as shown below:

In the Specification

Column 6, Line 47, "(HYPE), and ion beam assisted deposition (MAD)." should read as "(HVPE), and ion beam assisted deposition (IBAD)."

Signed and Sealed this
Twenty-fifth Day of November, 2014

Michelle K. Lee
*Deputy Director of the United States Patent and Trademark Office*